(12) United States Patent
Minegishi et al.

(10) Patent No.: US 9,040,232 B2
(45) Date of Patent: May 26, 2015

(54) METHOD FOR PATTERN FORMATION, METHOD AND COMPOSITION FOR RESIST UNDERLAYER FILM FORMATION, AND RESIST UNDERLAYER FILM

(75) Inventors: Shin-ya Minegishi, Tokyo (JP); Shin-ya Nakafuji, Tokyo (JP); Satoru Murakami, Tokyo (JP); Toru Kimura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 13/246,915

(22) Filed: Sep. 28, 2011

(65) Prior Publication Data

US 2012/0129353 A1 May 24, 2012

(30) Foreign Application Priority Data

Sep. 29, 2010 (JP) ................... 2010-220067
Sep. 26, 2011 (JP) ................... 2011-208764

(51) Int. Cl.
 *G03F 7/20* (2006.01)
 *H01L 21/311* (2006.01)
 *G03F 7/09* (2006.01)
 *G03F 7/11* (2006.01)
 *C08K 5/42* (2006.01)
 *C08L 101/02* (2006.01)

(52) U.S. Cl.
 CPC ............ *H01L 21/31144* (2013.01); *C08K 5/42* (2013.01); *C08L 101/02* (2013.01); *G03F 7/094* (2013.01); *G03F 7/11* (2013.01)

(58) Field of Classification Search
 CPC ....... H01L 21/31144; C08K 5/42; G03F 7/20; G03F 7/26
 USPC .................................................. 430/322, 323
 See application file for complete search history.

(56) References Cited

U.S. PATENT DOCUMENTS

| | | |
|---|---|---|
| 2005/0215713 A1 | 9/2005 | Hessell et al. |
| 2008/0124650 A1* | 5/2008 | Angelopoulos et al. ... 430/270.1 |
| 2008/0227038 A1* | 9/2008 | Endo et al. .................... 430/324 |
| 2009/0186294 A1* | 7/2009 | Goldfarb et al. ........... 430/270.1 |

FOREIGN PATENT DOCUMENTS

| | | | |
|---|---|---|---|
| JP | 10-228113 | A | 8/1998 |
| JP | 2000-204115 | A | 7/2000 |
| JP | 2001-005186 | A | 1/2001 |
| JP | 2001-048859 | A | 2/2001 |
| JP | 2002-296789 | | 10/2002 |
| JP | 2004-168748 | | 6/2004 |
| JP | 2004-177668 | | 6/2004 |
| JP | 2007-231270 | A | 9/2007 |
| JP | WO 2010-021290 | * | 2/2010 |
| JP | 2010-107790 | | 5/2010 |

OTHER PUBLICATIONS

English translation of WO 2010-021290, Feb. 2010.*
Office Action issued Dec. 2, 2014, in Japanese Patent Application No. 2011-208764 filed Sep. 26, 2011 (w/ English translation).

* cited by examiner

*Primary Examiner* — Brittany Raymond
(74) *Attorney, Agent, or Firm* — Oblon, McClelland, Maier & Neustadt, L.L.P.

(57) ABSTRACT

Provided by the present invention is a method including: (1) forming a resist underlayer film on the upper face side of a substrate to be processed using a composition for forming a resist underlayer film, the composition containing (A) a compound having a group represented by the following formula (1); (2) forming a resist coating film by applying a resist composition on the resist underlayer film; (3) exposing the resist coating film by selectively irradiating the resist coating film with a radiation; (4) forming a resist pattern by developing the exposed resist coating film; and (5) forming a predetermined pattern on the substrate to be processed by sequentially dry etching the resist underlayer film and the substrate using the resist pattern as a mask.

(1)

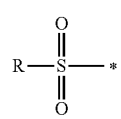

9 Claims, No Drawings

METHOD FOR PATTERN FORMATION, METHOD AND COMPOSITION FOR RESIST UNDERLAYER FILM FORMATION, AND RESIST UNDERLAYER FILM

BACKGROUND OF THE INVENTION

1. Field of Invention

The present invention relates to a pattern formation method, a method for resist underlayer film formation, a composition for resist underlayer film formation, and a resist underlayer film.

2. Description of the Related Art

In manufacture of integrated circuit devices, multilayer resist processes have been employed these days for attaining higher integrity. In brief, according to the multilayer resist process, a resist pattern is obtained by: applying a composition for resist underlayer film formation first on a substrate to be processed to form a resist underlayer film; applying a resist composition thereon to form a resist coating film; and then transferring a mask pattern on the resist coating film and developing in an appropriate developer using a stepper, etc. Thereafter this resist pattern is transferred on the resist underlayer film by dry etching. Finally, the resist underlayer film pattern is transferred to the substrate to be processed by dry etching, whereby a substrate on which a desired pattern is formed can be obtained.

In the aforementioned multilayer resist process, further miniaturization of the pattern to be formed has been enhanced, and thus there exist demands for additional improvement of the pattern transfer performance and etching resistance of the resist underlayer film. To meet such demands, various investigations for structures of and functional groups included in polymers which may be contained in compositions for forming a resist underlayer film have been carried out (see JP-A No. 2004-177668).

On the other hand, along with miniaturization of formed pattern, RIE (Reactive Ion Etching) has been in widespread use as the aforementioned dry etching process; therefore, disadvantages of occurrence of deformation such as bending or forming a corrugated shape of the underlayer film pattern have been marked during etching a substrate to be processed using a resist underlayer film as a mask. When the resist underlayer film is deformed, deterioration of the pattern transfer performance on the substrate to be processed is obliged. In this regard, improvement of bend resistance by introducing an alkylthienyl group to a polymer that forms a resist underlayer film was reported (see JP-A No. 2010-107790). However, this technique is disadvantageous in that sulfur components in outgas increases during formation of a resist underlayer film, thereby leading to increase of the odor.

PRIOR ART DOCUMENTS

Patent Documents

Patent Document 1: Japanese Examined Patent Application, Publication No. 2004-177668
Patent Document 2: Japanese Examined Patent Application, Publication No. 2010-107790

SUMMARY OF THE INVENTION

The present invention was made in view of the foregoing problems, and an object of the invention is to provide a pattern formation method capable of forming a resist underlayer film that is superior in bend resistance and etching resistance while controlling the odor of outgas during the formation of the resist underlayer film, and also capable of improving the pattern transfer performance. Also provided are a method for forming a resist underlayer film, a composition for forming a resist underlayer film and a resist underlayer film formed from the composition.

An aspect provided by the present invention which was made in order to solve the problems described above provides a method for forming a pattern, the method including:

(1) a resist underlayer film formation step of forming a resist underlayer film on the upper face side of a substrate to be processed using a composition for forming a resist underlayer film, the composition containing (A) a compound having a group represented by the following formula (1) (hereinafter, may be also referred to as "compound (A)"):

[formula 1]

in the formula (1), R represents a monovalent organic group having 1 to 30 carbon atoms; however, this organic group does not include an oxygen atom at the end of the side adjacent the sulfur atom, and * represents a bonding hand;

(2) a resist coating film formation step of forming a resist coating film by applying a resist composition on the resist underlayer film;

(3) an exposure step of exposing the resist coating film by selectively irradiating the resist coating film with a radiation;

(4) a resist pattern formation step of forming a resist pattern by developing the exposed resist coating film; and (5) a pattern formation step of forming a predetermined pattern on the substrate to be processed by sequentially dry etching the resist underlayer film and the substrate using the resist pattern as a mask.

According to the method for forming a pattern of the present invention, since the composition for forming a resist underlayer film containing the compound (A) having properties described later is used, a resist underlayer film that is superior in bend resistance and etching resistance can be formed while controlling the odor of outgas during the formation of the resist underlayer film, and can form a pattern through improving the pattern transfer performance to a substrate to be processed.

In a further aspect, it is preferred that the method includes after the resist underlayer film formation step (1) and prior to the resist coating film formation step (2), a step of:

(1') an intermediate layer formation step of forming an intermediate layer on the upper face side of the resist underlayer film, and in the pattern formation step (5), the intermediate layer is further dry etched.

According to the method for forming a pattern, a pattern can be similarly formed also when the step described above is further included.

It is preferred that the compound (A) has at least one ring selected from the group consisting of an aromatic ring and a heteroaromatic ring, and the bonding hand denoted by * in the group represented by the above formula (1) is preferably linked directly or via an oxygen atom to the ring. According to the present method for forming a pattern, bend resistance and etching resistance of the resist underlayer film formed is further improved since the composition for forming a resist underlayer film used has the properties described later.

R in the above formula (1) preferably represents at least one group selected from the set consisting of an aryl group which may have a substituent and a heteroaryl group which may have a substituent. According to the present method for forming a pattern, since the compound (A) has an organic sulfonyl group including the group having a specific structure, further improvement of the bend resistance and etching resistance of the resist underlayer film formed is enabled.

The compound (A) preferably has a partial structure represented by the following formula (2).

[formula 2]

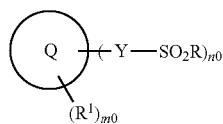
(2)

in the formula (2), Q represents a partial structure consisting of an aromatic ring or a heteroaromatic ring; R is as defined in the above formula (1); Y represents a single bond or an oxygen atom; n0 is an integer of 1 or greater; $R^1$ represents a monovalent organic group; m0 is an integer of 0 or greater; and provided that the number of R, Y and $R^1$ is each more than one, each of R, Y and $R^1$ may be the same or different.

According to the method for forming a pattern, since the compound (A) has a partial structure represented by the above formula (2), further improvement of the bend resistance and etching resistance of the resist underlayer film formed is enabled.

The compound (A) is preferably a polymer. When the compound (A) is a polymer, bend resistance and etching resistance of the resist underlayer film formed by the method for forming a pattern are further improved.

The polymer is preferably at least one resin selected from the group consisting of a novolak resin, a resol resin, a styrene resin, an acenaphthylene resin and a polyarylene resin. Since the polymer as the compound (A) is the particular resin described above, a high carbon content of the resist underlayer film formed in the method for forming a pattern can be attained, and thus further improvement of the bend resistance and etching resistance is enabled.

It is also preferred that the compound (A) be a crosslinkable compound. When the compound (A) is a crosslinkable compound, a resist underlayer film having superior strength can be formed by a crosslinking reaction. As a result, further improvement of the bend resistance and etching resistance of the resist underlayer film formed is enabled in the present method for forming a pattern.

It is preferred that the composition for forming a resist underlayer film further contains (B) a solvent. When the solvent (B) is further contained, workability in forming the resist underlayer film according to the method for forming a pattern can be improved.

The method for forming a resist underlayer film of the present invention includes (1) forming a coated film by applying a composition for forming a resist underlayer film, the composition containing (A) a compound having a group represented by the following formula (1) on a substrate to be processed, and (2) forming a resist underlayer film by heating the coated film.

[formula 3]

(1)

In the formula (1), R represents a monovalent organic group having 1 to 30 carbon atoms; however, this organic group does not include an oxygen atom at the end of the side adjacent the sulfur atom, and * represents a bonding hand.

According to the method for forming a resist underlayer film, a resist underlayer film that is superior in the bend resistance, etching resistance and the pattern transfer performance can be formed while controlling the odor of outgas during the formation of the resist underlayer film.

The composition for forming a resist underlayer film of the present invention contains (A) a compound having a group represented by the following formula (1):

[formula 4]

(1)

in the formula (1), R represents a monovalent organic group having 1 to 30 carbon atoms; however, this organic group does not include an oxygen atom at the end of the side adjacent the sulfur atom, and * represents a bonding hand.

Since the composition for forming a resist underlayer film of the present invention contains the compound (A) having a group represented by the above formula (1) (hereinafter, may be also referred to as "organic sulfonyl group"), it can form a resist underlayer film that is superior in bend resistance and etching resistance. Also, as a consequence, the pattern transfer performance to the substrate to be processed can be improved. Although grounds for achieving the aforementioned characteristics due to containing the compound (A) having an organic sulfonyl group in the composition for forming a resist underlayer film are not necessarily clear, it is proven that the presence of this organic sulfonyl group improves the strength of the resist underlayer film against etching gas.

Moreover, according to the composition for forming a resist underlayer film, the odor of outgas during formation of a resist underlayer film can be controlled. This reduction is believed to result from becoming less likely to produce highly volatile sulfur-containing substances due to including in the compound (A) a sulfonyl group in which a sulfur atom binds to an oxygen atom.

It is preferred that the compound (A) has at least one ring selected from an aromatic ring and a heteroaromatic ring, and a binding hand represented by * in the group represented by the above formula (1) binds to this ring directly or via an oxygen atom. According to the composition for forming a resist underlayer film, due to binding of the organic sulfonyl group to the aforementioned specific position, bend resistance and etching resistance of the resultant resist underlayer film are further improved. Furthermore, the compound (A) having the aforementioned structure can be conveniently synthesized from a thermosetting resin, a phenolic compound which has been broadly used as a crosslinkable compound, or the like.

R in the above formula (1) preferably represents at least one group selected from the set consisting of an aryl group which may have a substituent and a heteroaryl group which may have a substituent. According to the composition for forming a resist underlayer film, due to the compound (A) having an organic sulfonyl group including the group having a specific structure, further improvement of the bend resistance and etching resistance of the resultant resist underlayer film is enabled. In addition, the compound (A) having the aforementioned structure can be conveniently synthesized using an organic sulfonylation reagent that is readily available.

The resist underlayer film of the present invention is formed from the composition for forming a resist underlayer film. Therefore, the resist underlayer film is superior in the bend resistance and etching resistance, and consequently, is also superior in the pattern transfer performance to the substrate to be processed.

As described in the foregoing, according to the method for forming a pattern of the present invention, resist underlayer film that is superior in the bend resistance and also superior in the etching resistance can be formed while controlling the odor of outgas during the formation of the resist underlayer film, and improvement of the pattern transfer performance is enabled.

DESCRIPTION OF THE PREFERRED EMBODIMENTS

Hereinafter, embodiments of the composition for forming a resist underlayer film, the resist underlayer film, the method for forming a resist underlayer film, and the method for forming a pattern of the present invention are explained in this order.

<Composition for Forming Resist Underlayer Film>

The composition for forming a resist underlayer film contains (A) a compound, and (B) a solvent as a suitable component, and further may contain other optional component in the range not to deteriorate the advantageous effects of the invention. Hereinafter, each component is explained.

<(A) Compound>

The compound (A) has the group represented by the above formula (1). Since the composition for forming a resist underlayer film contains the compound (A) having the organic sulfonyl group represented by the above formula (1), a resist underlayer film that is superior in the bend resistance and the pattern transfer performance, and also superior in the etching resistance can be formed. In addition, sulfur-containing components in the outgas generated during the formation of the resist underlayer film can be reduced, and thus the odor can be controlled.

Although the mechanism for achieving the aforementioned characteristics by including the compound (A) in the composition for forming a resist underlayer film is not necessarily evident, it was revealed that the presence of the organic sulfonyl group included in the compound (A) enhances the strength against the etching gas of the resist underlayer film. Furthermore, according to the composition for forming a resist underlayer film, the odor of the outgas during the formation of the resist underlayer film can be reduced. This reduction is believed to result from becoming less likely to produce highly volatile sulfur-containing substances due to including in the compound (A) not an organic group having a thiophene skeleton or the like as a sulfur component, but a sulfur atom as a sulfonyl group.

In the above formula (1), R represents a monovalent organic group having 1 to 30 carbon atoms. However, this organic group does not include an oxygen atom at the end of the side adjacent the sulfur atom, and * represents a bonding hand.

Examples of the monovalent organic group represented by R described above include alkyl groups having 1 to 30 carbon atoms, alkenyl groups having 2 to 30 carbon atoms, alkynyl groups having 2 to 30 carbon atoms, cycloalkyl groups having 3 to 30 carbon atoms, cycloalkenyl groups having 3 to 30 carbon atoms, cycloalkynyl groups having 8 to 30 carbon atoms, aryl groups having 6 to 30 carbon atoms, aralkyl groups having 7 to 30 carbon atoms, heterocyclic groups having 3 to 30 carbon atoms, and the like. A part or all hydrogen atoms of these alkyl groups, alkenyl groups, alkynyl groups, cycloalkyl groups, cycloalkenyl groups, cycloalkynyl groups, aryl groups, aralkyl groups and heterocyclic groups may be substituted with a substituent. Examples of the substituent include alkyl groups having 1 to 10 carbon atoms, cycloalkyl groups having 3 to 10 carbon atoms, aryl groups having 6 to 15 carbon atoms, aralkyl groups having 7 to 15 carbon atoms, heterocyclic groups having 3 to 15 carbon atoms, halogen atoms such as a fluorine atom, a chlorine atom, a bromine atom and an iodine atom, a hydroxyl group, an amino group, a carboxyl group, alkoxy groups, alkylcarbonyl groups, alkoxycarbonyl groups, arylcarboxy groups, aryloxycarbonyl groups, amide groups, alkylamide groups, arylamide groups, and the like.

Examples of the alkyl group having 1 to 30 carbon atoms include a methyl group, an ethyl group, a linear or branched propyl group, a butyl group, a pentyl group, a hexyl group, a heptyl group, an octyl group, a nonyl group, a decyl group, a dodecyl group, a tetradecyl group, a hexadecyl group, an icosyl group, and the like.

Examples of the alkenyl group having 2 to 30 carbon atoms include an ethenyl group, a linear or branched propenyl group, a butenyl group, a pentenyl group, a hexenyl group, a heptenyl group, an octenyl group, a nonenyl group, a decenyl group, a dodecenyl group, a tetradecenyl group, a hexadecenyl group, an icocenyl group, and the like.

Examples of the alkynyl group having 2 to 30 carbon atoms include an ethynyl group, a linear or branched propynyl group, a butynyl group, a pentynyl group, a hexynyl group, a heptynyl group, an octynyl group, a nonynyl group, a decynyl group, a dodecynyl group, a tetradecynyl group, a hexadecynyl group, an icosynyl group, and the like.

Examples of the cycloalkyl group having 3 to 30 carbon atoms include monocyclic groups such as a cyclopropyl group, a cyclobutyl group, a cyclopentyl group, a cyclohexyl group, a cyclopentyl group, a cycloheptyl group, a cyclooctyl group, a cyclodecyl group and a cycloicosyl group, polycyclic groups such as a dicyclopentyl group, a dicyclohexyl group, a norbornyl group, an adamantyl group, a tricyclodecyl group and a tetracyclododecyl group, and the like.

Examples of the cycloalkenyl group having 3 to 30 carbon atoms include monocyclic groups such as a cyclopropenyl group, a cyclobutenyl group, a cyclopentenyl group, a cyclohexenyl group, a cycloheptenyl group, a cyclooctenyl group, a cyclodecenyl group and a cycloicocenyl group; and polycyclic groups such as a dicyclopentenyl group, a dicyclohexenyl group, a norbornenyl group, a tricyclodecynyl group and a tetracyclododecanyl group.

Examples of the cycloalkynyl group having 8 to 30 carbon atoms include monocyclic groups such as a cyclooctynyl group, a cyclodecynyl group and a cycloicosynyl group; and polycyclic groups such as a tetracyclododecynyl group.

Examples of the aryl group having 6 to 30 carbon atoms include a phenyl group, an o-tolyl group, a m-tolyl group, a p-tolyl group, an o-ethylphenyl group, a m-ethylphenyl group, a p-ethylphenyl group, a xylyl group, a cumenyl group, a mesityl group, a naphthyl group, an anthryl group, a phenanthryl group, and the like.

Examples of the aralkyl group having 7 to 30 carbon atoms include a benzyl group, a phenethyl group, and the like.

Examples of the heterocyclic group having 3 to 30 carbon atoms include heteroaryl groups such as a furanyl group, a furfuryl group, an isobenzofuranyl group, a pyrrolyl group, an indolyl group, an isoindolyl group, an imidazolyl group, a thiophenyl group, a phosphoryl group, a pyrazolyl group, a pyridinyl group, a quinolinyl group, a pyranyl group, an oxazolyl group, an isooxazolyl group, a thiazolyl group, a benzofuranyl group, a benzothiophenyl group, a benzophosphoryl group, a benzoimidazolyl group, a benzooxazolyl group, a benzoisooxazolyl group, and a benzothiazolyl group; nonheteroaromatic heterocyclic groups such as a tetrahydrofuranyl group, a tetrahydrofurfuryl group, a tetrahydropyranyl group, a pyranylmethyl group, a tetrahydropyranylmethyl group, a tetrahydrothiophenyl group, a pyrrolidinyl group and a piperidinyl group, and the like.

Of these examples of R, in light of improvement of the bend resistance and etching resistance of the resultant resist underlayer film since the strength against the etching gas of the resist underlayer film is believed to be efficiently enhanced, an aryl group having 6 to 30 carbon atoms which may have a substituent, an aralkyl groups having 7 to 30 carbon atom which may have a substituent, and a heterocyclic group having 3 to 30 carbon atoms which may have a substituent are preferred, and an aryl group having 6 to 30 carbon atoms which may have a substituent and a heteroaryl group having 3 to 30 carbon atoms which may have a substituent are more preferred. In light of ease in synthesis of the compound (A), a phenyl group, a tolyl group, a naphthyl group, and a thiophenyl group are still more preferred.

Specific examples of the organic sulfonyl group represented by the above formula (1) include alkylsulfonyl groups such as a methylsulfonyl group, an ethylsulfonyl group, a propylsulfonyl group, a butylsulfonyl group, a propylsulfonyl group, a hexylsulfonyl group, an octylsulfonyl group, a decylsulfonyl group, a hexadecylsulfonyl group and an icosylsulfonyl group; alkenylsulfonyl groups such as an ethenylsulfonyl group and a propenylsulfonyl group; alkynylsulfonyl groups such as an ethynylsulfonyl group and a propynylsulfonyl group; cycloalkylsulfonyl groups such as a cyclobutylsulfonyl group, a cyclopentylsulfonyl group, a cyclohexylsulfonyl group, a cyclooctylsulfonyl group, a norbornylsulfonyl group and an adamantylsulfonyl group; cycloalkenylsulfonyl groups such as a cyclopentynylsulfonyl group, a cyclooctynylsulfonyl group and a norbornenylsulfonyl group; cycloalkynylsulfonyl groups such as a cyclododecynylsulfonyl group and a cyclododecynylsulfonyl group; arylsulfonyl groups such as a phenylsulfonyl group, an o-tolylsulfonyl group, a m-tolylsulfonyl group, a p-tolylsulfonyl group, an ethylphenylsulfonyl group, a xylylsulfonyl group, a mesitylsulfonyl group, a naphthylsulfonyl group, an anthrylsulfonyl group and a phenanthrylsulfonyl group; aralkylsulfonyl groups such as a benzylsulfonyl group and a phenethylsulfonyl group; and heterocyclic group-substituted sulfonyl groups e.g., heteroarylsulfonyl groups such as a furanylsulfonyl group, a furfurylsulfonyl group, an isobenzofuranylsulfonyl group, a pyrrolylsulfonyl group, an indolylsulfonyl group, an isoindolylsulfonyl group, an imidazolylsulfonyl group, a thiophenylsulfonyl group, a phosphorylsulfonyl group, a pyrazolylsulfonyl group, a pyridinylsulfonyl group, a quinolinylsulfonyl group, a pyranylsulfonyl group, an oxazolylsulfonyl group, an isooxazolylsulfonyl group, a thiazolylsulfonyl group, a benzofuranylsulfonyl group, a benzothiophenylsulfonyl group, a benzophosphorylsulfonyl group, a benzoimidazolylsulfonyl group, a benzooxazolylsulfonyl group, a benzoisooxazolylsulfonyl group and a benzothiazolylsulfonyl group; nonheteroarylsulfonyl groups such as a tetrahydrofuranylsulfonyl group, a tetrahydrofurfurylsulfonyl group, a tetrahydropyranylsulfonyl group, a pyranylmethylsulfonyl group, a tetrahydropyranylmethylsulfonyl group, a tetrahydrothiophenylsulfonyl group, a pyrrolidinylsulfonyl group and a piperidinylsulfonyl group, and the like.

Of these, an arylsulfonyl group, an alkenylsulfonyl group and a heteroarylsulfonyl group are preferred, an arylsulfonyl group and a heteroarylsulfonyl group are more preferred. Among them, a phenylsulfonyl group, a p-tolylsulfonyl group, a naphthylsulfonyl group and a thiophenylsulfonyl group are still more preferred.

The number of the aforementioned organic sulfonyl group in the compound (A) is not particularly limit, and may be one, or two or more. In light of improvement of the bend resistance and etching resistance, the lower limit of the ratio of the organic sulfonyl group present in the compound (A) is preferably 0.0005 mol/g, more preferably 0.001 mol/g, still more preferably 0.003 mol/g, and particularly preferably 0.005 mol/g. The organic sulfonyl group included in the compound (A) may be of one type, or may be of a plurality of types.

In the compound (A), the site to which the organic sulfonyl group is linked is not particularly limited, and in light of improvement of the bend resistance, the pattern transfer performance and the etching resistance, the compound (A) preferably has at least one ring selected from the group consisting of an aromatic ring and a heteroaromatic ring, and the bonding hand denoted by * in the group represented by the above formula (1) is preferably linked directly or via an oxygen atom to the ring. In other words, the compound (A) preferably has a partial structure represented by the above formula (2).

In the above formula (2), Q represents a partial structure consisting of an aromatic ring or a heteroaromatic ring; R is as defined in the above formula (1); Y represents a single bond or an oxygen atom; n0 is an integer of 1 or greater; $R^1$ represents a monovalent organic group; m0 is an integer of 0 or greater; and provided that the number of R, Y and $R^1$ is each more than one, each of R, Y and $R^1$ may be the same or different.

The aromatic ring represented by Q is exemplified by a benzene ring. In addition, the heteroaromatic ring represented by Q is exemplified by a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring, a triazine ring, and the like.

The n0 is preferably an integer of 1 to 5, more preferably an integer of 1 to 3, and still more preferably 1 or 2. The m0 is preferably an integer of 0 to 5, more preferably an integer of 0 to 3, and still more preferably an integer of 0 to 2.

Examples of the monovalent organic group represented by $R^1$ include the examples of the monovalent organic group of R represented by the above formula (1).

The aromatic ring and the heteroaromatic ring in the partial structure represented by the above formula (2) may form a covalent bond with a partial structure other than its partial structure, or may be annelated with a benzene ring or a heteroaromatic ring, etc., in other partial structure.

The compound (A) is preferably a polymer (hereinafter, may be also referred to as "(A1) polymer"). Also, it may be preferably a crosslinkable compound (hereinafter, may be also referred to as "(A2) crosslinkable compound"). Hereinafter, (A1) polymer, and (A2) crosslinkable compound are explained in this order.

<(A1) Polymer>

The polymer (A1) has the group represented by the above formula (1). Since the polymer (A1) has the organic sulfonyl group described above, the strength of the resulting resist underlayer film is improved, and as a result, the bend resistance and etching resistance are further improved.

The polymer (A1) is not particularly limited as long as it is a polymer having an organic sulfonyl group, and a polymer including an aromatic ring is preferred in view of possibility of increasing the carbon content, and further improvement of the bend resistance and etching resistance.

Examples of the polymer including an aromatic ring include novolak resins, resol resins, styrene resins, acenaphthylene resins, polyarylene resins, and the like.

In addition, specific examples of the polymer including the aromatic ring include polymers having the structural unit represented by the following formula (a), and the like.

[formula 5]

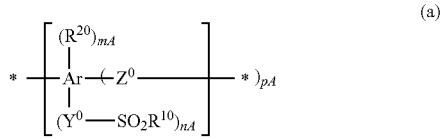

in the above formula (a), Ar represents an aromatic group having a valency of (mA+nA+pA+1); $Y^0$ each independently represents a single bond, an oxygen atom or —NR'—, wherein R' represents a hydrogen atom or a monovalent organic group; $R^{10}$ has the same meaning as that of R in the above formula (1); $R^{20}$ each independently represents a hydroxyl group, an alkyl group having 1 to 6 carbon atoms, an alkoxy group having 1 to 6 carbon atoms, an alkoxycarbonyl group having 2 to 10 carbon atoms, an aryl group having 6 to 14 carbon atoms, a glycidyl ether group or alkyl glycidyl ether group, wherein the alkyl moiety in the alkyl glycidyl ether group has 1 to 6 carbon atoms, and wherein a part or all of hydrogen atoms of these alkyl group, alkoxy group, alkoxycarbonyl group, aryl group, glycidyl ether group and alkyl glycidyl ether group may be substituted with a substituent; $Z^0$ represents a single bond, a methylene group, an alkylene group having 2 to 20 carbon atoms, an arylene group having 6 to 14 carbon atoms, or an oxyalkylene group, wherein a part or all of hydrogen atoms of these methylene group, alkylene group, arylene group and oxyalkylene group may be substituted with a substituent; pA indicates the bond number of $Z^0$ bonded to Ar and represents an integer of 1 to 6; mA represents an integer of 0 to 6; nA represents an integer of 1 to 6; and * represents a bonding hand.

The aromatic group having a valency of (mA+nA+pA+1) represented by Ar is exemplified by a group obtained by removing hydrogen atoms in the number of (mA+nA+pA+1) from a benzene aromatic ring such as a benzene ring, a naphthalene ring, an anthracene ring, an indene ring or a fluorenylidenebiphenyl ring, a heterocyclic aromatic ring such as a furan ring, a pyrrole ring, a thiophene ring, a phosphole ring, a pyrazole ring, an oxazole ring, an isoxazole ring, a thiazole ring, a pyridine ring, a pyrazine ring, a pyrimidine ring, a pyridazine ring or a triazine ring.

The polymer having a structural unit represented by the above formula (a) may be exemplified by polymer having a structural unit represented by the following formula (a1), or the structural unit represented by the formula (a2), and the like.

[formula 6]

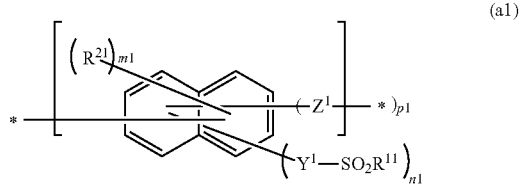

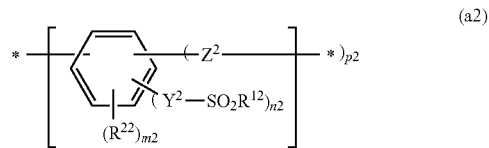

In the above formulae (a1) and (a2), $Y^1$ and $Y^2$ each independently represent a single bond, an oxygen atom or —NR'—, wherein R' represents a hydrogen atom or a monovalent organic group; $R^{11}$ and $R^{12}$ have the same meaning as that of R in the above formula (1); n1 represents an integer of 1 to 6; n2 represents an integer of 1 to 4, and provided that n1 and n2 are each 2 or greater, each of $Y^1$ and $R^{11}$, and $Y^2$ and $R^{12}$ may be the same or different; $R^{21}$ and $R^{22}$ each independently represents a hydroxyl group, an alkyl group having 1 to 6 carbon atoms, an alkoxy group having 1 to 6 carbon atoms, an alkoxycarbonyl group having 2 to 10 carbon atoms, an aryl group having 6 to 14 carbon atoms, a glycidyl ether group or alkyl glycidyl ether group, wherein the alkyl moiety in the alkyl glycidyl ether group has 1 to 6 carbon atoms, and wherein a part or all of hydrogen atoms of these alkyl group, alkoxy group, alkoxycarbonyl group, aryl group, glycidyl ether group and alkyl glycidyl ether group may be substituted with a substituent; m1 represents an integer of 0 to 6; m2 represents an integer of 0 to 4; and, provided that m1 and m2 are each 2 or greater, each of $R^{21}$ and $R^{22}$ may be the same or different; $Z^1$ and $Z^2$ represent a single bond, a methylene group, an alkylene group having 2 to 20 carbon atoms, an arylene group having 6 to 14 carbon atoms, or an oxyalkylene group, wherein a part or all of hydrogen atoms of these methylene group, alkylene group, arylene group and oxyalkylene group may be substituted with a substituent; p1 indicates the bond number of $Z^1$ bonded to the aromatic ring and represents an integer of 1 to 8; p2 indicates the bond number of $Z^2$ bonded to the aromatic ring and represents an integer of 1 to 4, and provided that p1 and p2 are each 2 or greater, each $Z^1$ and $Z^2$ may be the same or different, and provided that p1 and p2 are each 2 or greater, bonding of $Z^1$ and $Z^2$ in the number of 2 or greater to the aromatic ring is indicated, and also indicated is that the polymer having an aromatic ring has a branched structure or a network structure; n1, m1 and p1 satisfy the inequalition of 1≤n1+m1+p1≤8, and n2, m2 and p2 satisfy the inequalition of 1≤n2+m2+m2≤8; and * represents a bonding hand.

Examples of the monovalent organic group represented by R' in —NR'— of the aforementioned $Y^1$ and $Y^2$ include an alkyl group having 1 to 10 carbon atoms, a cycloalkyl group having 3 to 10 carbon atoms, an aryl group having 6 to 20 carbon atoms, an aralkyl group having 7 to 20 carbon atoms, and the like.

Examples of the alkyl group having 1 to 6 carbon atoms represented by $R^{21}$ and $R^{22}$ include a methyl group, an ethyl group, a n-propyl group, an i-propyl group, a n-butyl group, a 2-methylpropyl group, a 1-methylpropyl group, a t-butyl group, and the like.

Examples of the alkoxy group having 1 to 6 carbon atoms represented by $R^{21}$ and $R^{22}$ include a methoxy group, an ethoxy group, a n-propoxy group, an i-propoxy group, a n-butoxy group, a 2-methylpropoxy group, a 1-methylpropoxy group, a t-butoxy group, a 2-propynyl oxy group, and the like.

Examples of the alkoxycarbonyl group having 2 to 10 carbon atoms represented by $R^{21}$ and $R^{22}$ include a methoxycarbonyl group, an ethoxycarbonyl group, a n-propoxycarbonyl group, an i-propoxycarbonyl group, a n-butoxycarbonyl group, a 2-methylpropoxycarbonyl group, a 1-methylpropoxycarbonyl group, a t-butoxycarbonyl group, and the like.

Examples of the aryl group having 6 to 14 carbon atoms represented by $R^{21}$ and $R^{22}$ include a phenyl group, a naphthyl group, and the like.

Examples of the alkyl glycidyl ether group represented by $R^{21}$ and $R^{22}$ include a methyl glycidyl ether group, an ethyl glycidyl ether group, a propyl glycidyl ether group, a butyl glycidyl ether group, and the like.

Examples of the alkylene group having 2 to 20 carbon atoms represented by $Z^1$ and $Z^2$ include an ethylene group; propylene groups such as a 1,3-propylene group and a 1,2-propylene group; a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

Examples of the arylene group having 6 to 14 carbon atoms represented by $Z^1$ and $Z^2$ include a phenylene group, a naphthylene group, an anthrylene group, a phenanthrylene group, and the like.

The number of carbon atoms of the alkylene chain in the oxyalkylene group represented by $Z^1$ and $Z^2$ is preferably 2 to 20. Examples of such oxyalkylene groups include an oxyethylene group; oxypropylene groups such as a 1,3-oxypropylene group and a 1,2-oxypropylene group; an oxytetramethylene group, an oxypentamethylene group, an oxyhexamethylene group, and the like.

The foregoing $R^{20}$, $R^{21}$, $R^{22}$, $Z^0$, $Z^1$ and $Z^2$ may have a substituent. Examples of the substituent include a halogen atom, hydroxyl group, an alkyl group having 1 to 9 carbon atoms, an aryl group having 6 to 22 carbon atoms, and the like. Examples of the halogen atom include fluorine, chlorine, bromine, iodine, and the like. Examples of the alkyl group having 1 to 9 carbon atoms include a methyl group, ethyl group, n-propyl group, i-propyl group, n-butyl group, 2-methylpropyl group, 1-methylpropyl group, t-butyl group, and the like. Examples of the aryl group having 6 to 22 carbon atoms include a phenyl group, naphthyl group, and the like.

Examples of the novolak resin include resins obtained by allowing one or at least two types of phenolic compounds selected from the group consisting of phenols such as phenol, cresol, xylenol, resorcinol, bisphenol A, p-tert-butylphenol and p-octylphenol, and naphthols such as α-naphthol, β-naphthol, 1,5-dihydroxynaphthalene and 2,7-dihydroxynaphthalene to react with an aldehyde, a divinyl compound or the like using an acidic catalyst.

The aldehydes are exemplified by aldehyde such as formaldehyde; aldehyde sources such as paraformaldehyde and trioxane, and the like.

Examples of the divinyl compounds include divinylbenzene, dicyclopentadiene, tetrahydroindene, 4-vinylcyclohexene, 5-vinylnorborn-2-ene, α-pinene, β-pinene, limonene, 5-vinylnorbornadiene, and the like.

Examples of the resol resin include polymers obtained by allowing the phenolic compound to react with the aldehyde using an alkaline catalyst, and the like.

Examples of the styrene resin include polymers having the structural unit represented by the following formula (a3), and the like.

[formula 7]

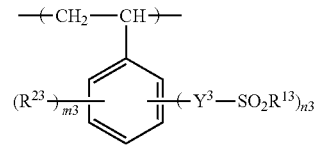

(a3)

In the above formula (a3), $Y^3$ represents a single bond, an oxygen atom or —NR'—, wherein R' represents a monovalent organic group; $R^{13}$ has the same meaning as that of R in the above formula (1); n3 represents an integer of 1 to 5, and provided that n3 is 2 or greater, each of $Y^3$ and $R^{13}$ may be the same or different; $R^{23}$ each independently represents an alkyl group, an aryl group, a hydroxyl group, an alkoxy group, an aryloxy group, an alkoxycarbonyl group or an aryloxycarbonyl group; m3 represents an integer of 0 to 4, and provided that m3 is 2 or greater, each of $R^{23}$ may be the same or different; and n3 and m3 satisfy the inequalition of $1 \leq n3 + m3 \leq 5$.

Examples of the monovalent organic group represented by R' in —NR'— of the aforementioned $Y^3$ include the same groups as those represented by R' of $Y^1$ in the above formula (a2), and the like.

Examples of the alkyl group represented by $R^{23}$ include alkyl groups having 1 to 10 carbon atoms, and for example, a methyl group, an ethyl group, a n-propyl group, an i-propyl group, a n-butyl group, a 2-methylpropyl group, a 1-methylpropyl group, a t-butyl group, and the like.

Examples of the aryl group represented by $R^{23}$ include aryl groups having 6 to 30 carbon atom, and for example, a phenyl group, a naphthyl group, and the like.

The styrene resin may have other structural unit in addition to the structural unit represented by the above formula (a3). Also, the other structural unit may have the organic sulfonyl group described above.

The monomer capable of providing the other structural unit is not particularly limit, and may be exemplified by a compound having any of a variety of polymerizable unsaturated bonds. Examples of the compound having such a polymerizable unsaturated bond include styrene monomers such as α-methylstyrene, (meth)acrylic esters such as (meth)acrylonitrile, (meth)acrylic acid and methyl (meth)acrylate, acrylic monomers such as (meth)acrylamide; vinyl ethers such as ethyl vinyl ether, maleic anhydride, vinyl acetate, vinylpyridine, and the like. Alternatively, these monomers further having an organic sulfonyl group bonded thereto may be suitably used.

The percentage of the other structural unit included in the styrene resin is preferably less than 50% by mole, and more preferably less than 40% by mole, with respect to total structural units that constitute the styrene resin.

The degree of polymerization of the styrene resin, i.e., the total number of the structural unit represented by the above formula (a3) and other structural unit, is preferably 5 or greater and 200 or less, and more preferably 10 or greater and 150 or less.

A commercially available product may be also used as the prepolymer for forming the styrene resin, particularly, a polyvinylphenol polymer, and for example, "MARUKA LYNCUR M" (poly-p-vinylphenol), "MARUKA LYNCUR MB" (brominated poly-p-vinylphenol), "MARUKA LYNCUR CMM" (copolymer of p-vinylphenol and methyl methacrylate), "MARUKA LYNCUR CHM" (copolymer of p-vinylphenol and 2-hydroxyethyl methacrylate), "MARUKA LYNCUR CST" (copolymer of p-vinylphenol and styrene) manufactured by Maruzen Petrochemical Co., Ltd., or the like may be used.

Examples of the acenaphthylene resin include polymers having the structural unit represented by the following formula (a4), and the like.

[formula 8]

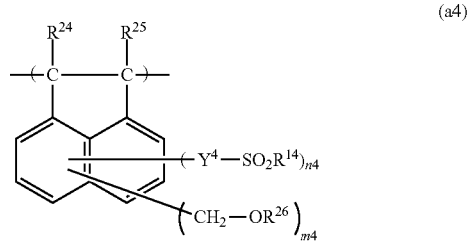

(a4)

In the above formula (a4), $Y^4$ represents a single bond, an oxygen atom or —NR'—, wherein R' represents a monovalent organic group; $R^{14}$ has the same meaning as that of R in the above formula (1); n4 represents an integer of 1 to 6, and provided that n4 is 2 or greater, each of $Y^4$ and $R^{14}$ may be the same or different; $R^{24}$ and $R^{25}$ each independently represent a hydrogen atom, a halogen atom, an alkyl group having 1 to 6 carbon atoms, an alkoxy group having 1 to 6 carbon atoms, an alkoxycarbonyl group having 2 to 10 carbon atoms or an aryl group having 6 to 14 carbon atoms, wherein a part or all of hydrogen atoms of these alkyl group, alkoxy group, alkoxycarbonyl group and aryl group may be substituted with a substituent; $R^{26}$ represents a hydrogen atom, an alkyl group having 1 to 6 carbon atoms, an alkoxy group having 1 to 6 carbon atoms, an alkoxycarbonyl group having 2 to 10 carbon atoms or an aryl group having 6 to 14 carbon atoms, wherein a part or all of hydrogen atoms of these alkyl group, alkoxy group, alkoxycarbonyl group and aryl group may be substituted with a substituent; and m4 represents an integer of 0 to 5, and provided that m4 is 2 or greater, each of $R^{26}$ may be the same or different.

Examples of the alkyl group having 1 to 6 carbon atoms represented by $R^{24}$ to $R^{26}$ include a methyl group, an ethyl group, a n-propyl group, an i-propyl group, a n-butyl group, a 2-methylpropyl group, a 1-methylpropyl group, a t-butyl group, and the like.

Examples of the alkoxy group having 1 to 6 carbon atoms represented by $R^{24}$ to $R^{26}$ include a methoxy group, an ethoxy group, a n-propoxy group, an i-propoxy group, a n-butoxy group, a 2-methylpropoxy group, a 1-methylpropoxy group, a t-butoxy group, and the like.

Examples of the alkoxycarbonyl group having 2 to 10 carbon atoms represented by $R^{24}$ to $R^{26}$ include a methoxycarbonyl group, an ethoxycarbonyl group, a n-propoxycarbonyl group, an i-propoxycarbonyl group, a n-butoxycarbonyl group, a 2-methylpropoxycarbonyl group, a 1-methylpropoxycarbonyl group, a t-butoxycarbonyl group, and the like.

Examples of the aryl group having 6 to 14 carbon atoms represented by $R^{24}$ to $R^{26}$ include a phenyl group, a naphthyl group, and the like.

Examples of the halogen atom represented by $R^{24}$ and $R^{25}$ include a fluorine atom, chlorine atom, bromine atom, iodine atom, and the like.

Examples of the substituent which may be carried by $R^{24}$ to $R^{26}$ include a halogen atom, a hydroxyl group, an alkyl group having 1 to 9 carbon atoms, an aryl group having 6 to 22 carbon atoms, and the like. Examples of the halogen atom include a fluorine atom, a chlorine atom, a bromine atom, an iodine atom, and the like.

Examples of the alkyl group having 1 to 9 carbon atoms include a methyl group, ethyl group, n-propyl group, i-propyl group, n-butyl group, 2-methylpropyl group, 1-methylpropyl group, t-butyl group, and the like.

Examples of the aryl group having 6 to 22 carbon atoms include a phenyl group, a naphthyl group, and the like.

The acenaphthylene resin can be obtained by polymerizing a compound having an acenaphthylene skeleton by way of radical polymerization, anionic polymerization, cationic polymerization or the like to give an appropriate polymeric form such as the form of a block polymer or a solution polymer. Also, as described in paragraph Nos. [0008] to [0031] of JP-A No. 2002-296789, the acenaphthylene resin can be obtained by a procedure such as allowing the polymer of the compound having an acenaphthylene skeleton to react with paraformaldehyde under an acidic condition.

Examples of the polyarylene resin include polyarylene ether, polyarylene sulfide, polyarylene ether sulfone, polyarylene ether ketone, and the like.

The weight average molecular weight (Mw) in terms of polystyrene of the polymer (A1) is preferably 500 to 100,000, more preferably 1,000 to 50,000, and still more preferably 1,200 to 40,000.

The number average molecular weight (Mn) in terms of polystyrene of the polymer (A1) is preferably 400 to 80,000, more preferably 800 to 40,000, and still more preferably 1,000 to 35,000.

The ratio of Mw to Mn (Mw/Mn ratio) of the polymer (A1) is usually 1 to 5, and more preferably 1 to 3. It is to be noted that the values of Mw and Mn may be determined by measuring on gel permeation chromatography (GPC) using a mono-dispersed polystyrene as a standard sample.

Also, the resin composition for forming a resist underlayer film of the present invention may contain only one type of the polymer (A1), or two or more types of the polymer (A1) may be contained.

<(A2) Crosslinkable Compound>

The crosslinkable compound (A2) has the group represented by the above formula (1). Since the crosslinkable compound has the organic sulfonyl group, the strength of the resulting resist underlayer film is enhanced by the crosslinking reaction, and as a result, the bend resistance and etching resistance can be further improved.

The crosslinkable compound (A2) is not particularly limited as long as it has the organic sulfonyl group described above, and has at least one crosslinkable functional group. The "crosslinkable functional group" means a functional group capable of forming a cross-linking bond that bridges between crosslinkable functional groups with each other, or between the crosslinkable compounds with each other, or the crosslinkable compound and other compound, by way of a reaction of the crosslinkable functional group with other functional group.

Examples of the crosslinkable functional group include nitrogen atom-containing groups such as amino groups to which at least one group selected from a methylol group, an alkoxymethyl group and an acyloxymethyl group is bonded; groups containing a heterocyclic 3-membered ring and a heterocyclic 4-membered ring such as an epoxy group and a thioepoxy group; groups having an unsaturated bond such as an isocyanate group, an azido group, and an alkenyl ether group; hydroxyl group-containing groups such as a hydroxyaryl group, and the like.

Examples of the crosslinkable compound include melamine compounds, guanamine compounds, glycoluril compounds and urea compounds in which the methylol group or the like is bonded to a nitrogen atom, epoxy compounds, thioepoxy compounds, isocyanate compounds, azido compounds, alkenyl ether compounds, phenolic compounds, and the like. The crosslinkable compound may be a low molecular weight compound, or may be a compound having a crosslinkable functional group introduced as a pendant group to the side chain of a polymer.

Examples of the crosslinkable compound include compounds represented by the following formulae, and the like.

[formula 9]

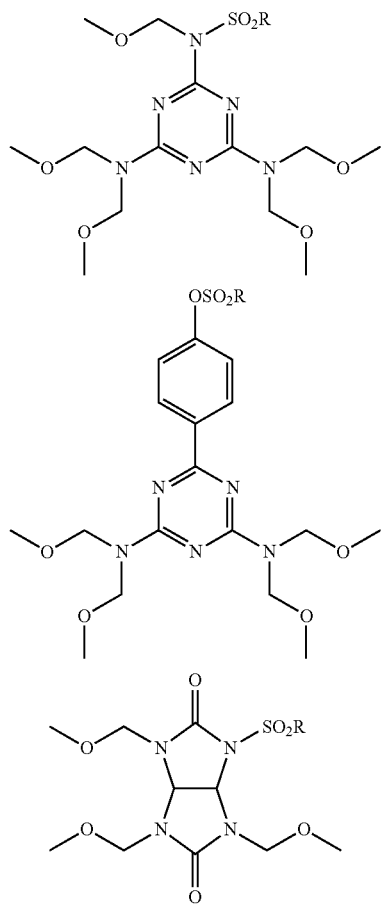

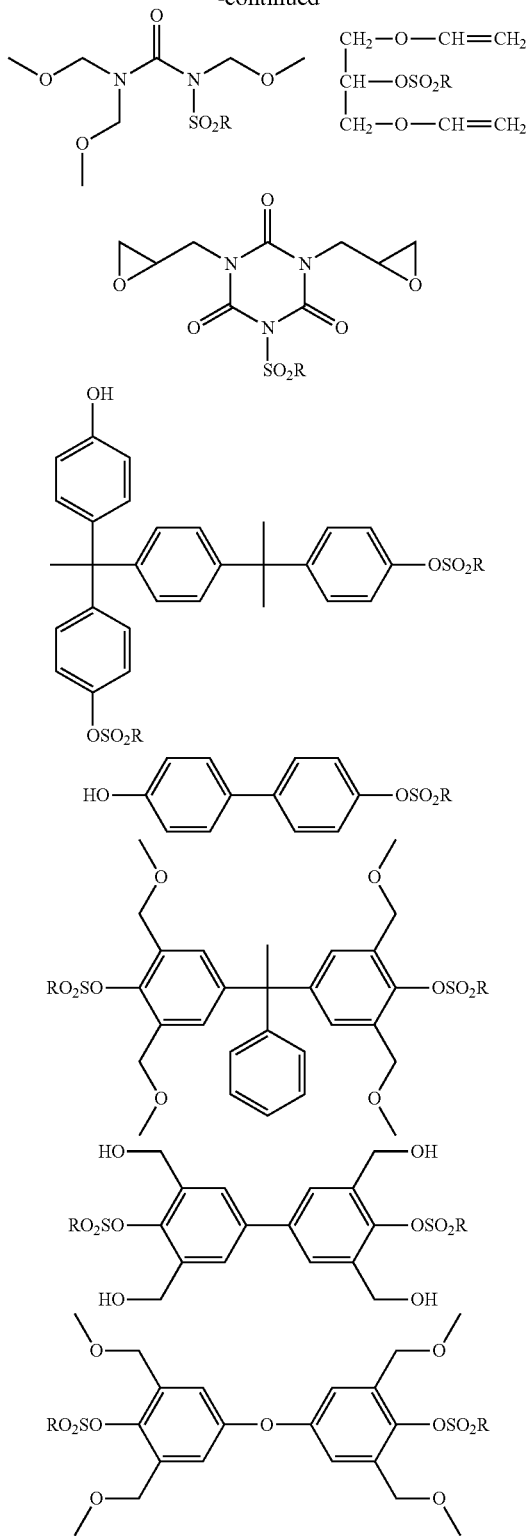

In the above formulae, R has the same meaning as that in the above formula (1).

The resin composition for forming a resist underlayer film may contain only one type of the crosslinkable compound (A2), or two or more types of the polymer (A2) may be contained.

In the composition for forming a resist underlayer film, the polymer (A1) polymer and the crosslinkable compound (A2) may be used in combination.

The content of the compound (A) in the composition for forming a resist underlayer film is, in light of improvement of the strength of the resulting resist underlayer film, preferably no less than 10% by mass, and more preferably no less than 30% by mass in terms of the percentage content of the compound (A) with respect to the total solid content in the composition for forming a resist underlayer film, i.e., the total content of the components other than the solvent (B) described later.

<Synthesis Method of Compound (A)>

The compound (A) having the organic sulfonyl group can be obtained by, for example, allowing a compound having a hydroxyl group to react with a compound for organic sulfonylation in the presence of a base such as pyridine.

[formula 10]

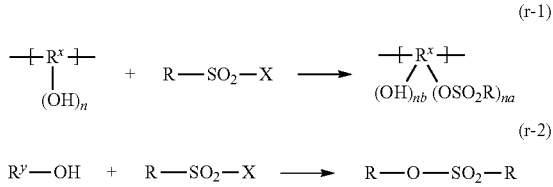

In the above formulae (r-1) and (r-2), R has the same meaning as that in the above formula (1); and X represents a halogen atom or a hydroxyl group. In the above formula (r-1), Rx represents a structural unit of the polymer; n represents an integer of 1 or more; and na and nb each independently represent an integer of 0 or more, and na and nb satisfy the equation of na+nb=n. In the above formula (r-2), $R^y$ represents a monovalent organic group.

The polymer (A1) can be obtained by, for example, as represented by the above formula (r-1), allowing a polymer having a hydroxyl group to react with an organic sulfonylation reagent represented by R—$SO_2$—X. Furthermore, the crosslinkable compound (A2) and the like can be obtained by, for example, as represented by the above formula (r-2), allowing a compound $R^y$—OH having a hydroxyl group to react with an organic sulfonylation reagent represented by R—$SO_2$—X.

In place of the compound having a hydroxyl group by using, for example, a compound having an amino group, an alkylamino group, a methylol group or an amino group to which an alkoxymethyl group is bonded, the compound (A) in which an organic sulfonyl group is bonded to a nitrogen atom can be obtained.

It is to be noted that the polymer (A1) can be synthesized by using a hydroxyl compound having $R^y$ that included a polymerizable functional group such as an unsaturated in the above formula (r-2) to obtain an organic sulfonyl group-containing monomer, and polymerizing the monomer by radical polymerization or the like.

<(B) Solvent>

The composition for forming a resist underlayer film usually contains a solvent. The solvent (B) is not particularly limited as long as it can dissolve the compound (A).

Examples of the (B) solvent include ethylene glycol monoalkyl ethers such as ethylene glycol monomethyl ether, ethylene glycol monoethyl ether, ethylene glycol mono-n-propyl ether, and ethylene glycol mono-n-butyl ether;

ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate;

diethylene glycol dialkyl ethers such as diethylene glycol dimethyl ether, diethylene glycol diethyl ether, diethylene glycol di-n-propyl ether, and diethylene glycol di-n-butyl ether;

triethylene glycol dialkyl ethers such as triethylene glycol dimethyl ether, and triethylene glycol diethyl ether;

propylene glycol monoalkyl ethers such as propylene glycol monomethyl ether, propylene glycol monoethyl ether, propylene glycol mono-n-propyl ether, and propylene glycol mono-n-butyl ether;

propylene glycol dialkyl ethers such as propylene glycol dimethyl ether, propylene glycol diethyl ether, propylene glycol di-n-propyl ether, propylene glycol di-n-butyl ether;

propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate;

lactic acid esters such as methyl lactate, ethyl lactate, n-propyl lactate, i-propyl lactate, n-butyl lactate, and i-butyl lactate;

aliphatic carboxylate esters such as methyl formate, ethyl formate, n-propyl formate, i-propyl formate, n-butyl formate, i-butyl formate, n-amyl formate, i-amyl formate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butyrate, ethyl butyrate, n-propyl butyrate, i-propyl butyrate, n-butyl butyrate, and i-butyl butyrate;

other esters such as ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxypropyl acetate, 3-methoxybutyl acetate, 3-methyl-3-methoxybutyl acetate, 3-methyl-3-methoxybutyl propionate, 3-methyl-3-methoxybutyl butyrate, methyl acetoacetate, methyl pyruvate, and ethyl pyruvate;

aromatic hydrocarbons such as toluene, and xylene; ketones such as methyl ethyl ketone, methyl n-propyl ketone, methyl n-butyl ketone, 2-heptanone, 3-heptanone, 4-heptanone, and cyclohexanone;

amides such as N-methylformamide, N,N-dimethylformamide, N-methylacetamide, N,N-dimethylacetamide, and N-methylpyrrolidone; lactones such as γ-butyrolactone, and the like.

Among these solvents (B), ethylene glycol monoalkyl ether acetate, propylene glycol monoalkyl ether, lactic acid esters, aliphatic carboxylate esters, other esters, ketones and lactones are preferred, ethylene glycol monoethyl ether acetate, propylene glycol monomethyl ether, ethyl lactate, n-butyl acetate, ethyl 3-ethoxypropionate, methyl 3-methoxypropionate, 2-heptanone, cyclohexanone and γ-butyrolactone are more preferred, and cyclohexanone is still more preferred. It is to be noted that one type of the solvent (B) may be used alone, or two or more may be used in combination.

The content of the solvent (B) in the composition for forming a resist underlayer film is in the range where the concentration of the total solid content of the resulting composition for forming a resist underlayer film becomes usually 1 to 80% by mass, preferably 3 to 40% by mass, and more preferably 5 to 30% by mass.

<Other Optional Components>

The resin composition for forming a resist underlayer film may further contain (C) other crosslinking agent, (D) an acid generator, (E) a promotor, (F) an additive and the like as needed in the range not to deteriorate the effects of the present invention. Of these, it is preferred that the promoter (E) be blended.

<(C) Other Crosslinking Agent>

The composition for forming a resist underlayer film may contain other crosslinking agent in addition to the crosslinkable compound (A2) described above.

Examples of the other crosslinking agent (C) include compounds not having the organic sulfonyl group represented by the above formula (1) in the examples of the crosslinkable compound (A2) described above, and the like.

<(D) Acid Generator>

The acid generator (D) is a component which generates an aid upon exposure or heating. When the composition for forming a resist underlayer film contains the acid generator (D), the crosslinking reaction is enabled to more efficiently proceed at comparatively low temperatures including ordinary temperatures between molecular chains of the compound (A).

Examples of the acid generator that generates an acid upon exposure (hereinafter, may be also referred to as "photo acid generator") include those disclosed in paragraph Nos. [0077] to of JP-A No. 2004-168748, and the like.

Among these photo acid generators, diphenyliodonium trifluoromethanesulfonate, diphenyliodonium nonafluoro-n-butanesulfonate, diphenyliodonium pyrenesulfonate, diphenyliodonium n-dodecyl benzenesulfonate, diphenyliodonium 10-camphorsulfonate, diphenyliodonium naphthalenesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium n-dodecylbenzenesulfonate, bis(4-t-butylphenyl)iodonium 10-camphorsulfonate, and bis(4-t-butylphenyl)iodonium naphthalenesulfonate are preferred. One type of these photo acid generators may be used alone, or two or more may be used in combination.

Also, examples of the acid generator that generates an acid upon heating (hereinafter, may be also referred to as "heat acid generator") include, 2,4,4,6-tetrabromocyclohexadienone, benzointosylate, 2-nitrobenzyltosylate, alkylsulfonates, and the like. One type of these heat acid generators may be used alone, and two or more types may be used in combination. Alternatively, the photo acid generator and the heat acid generator may be used in combination as the acid generator (D).

The content of the acid generator (D) in the composition for forming a resist underlayer film is usually no greater than 5,000 parts by mass, preferably 0.1 parts by mass to 1,000 parts by mass, and still more preferably 0.1 parts by mass to 100 parts by mass with respect to 100 parts by mass of the compound (A).

<(E) Promotor>

As the promoter (E), one-electron oxidants for sufficiently causing a dehydrogenation reaction required for oxidizative crosslinking, and the like may be exemplified. The one-electron oxidant refers to an oxidizing agent that receives one electron transfer itself. For example, in the case of cerium (IV) ammonium nitrate, cerium (IV) ion receives one electronic to convert into cerium (III) ion. A radical oxidant such as halogen is converted into an anion by receiving one electron. The phenomenon of oxidizing a substance (substrate, catalyst, etc.) to lose one electron therefrom is referred to as one-electron oxidation, and the substance that receives the one electron is referred to as a one-electron oxidant.

Typical examples of the one-electron oxidant are (a) a metal compound, (b) a peroxide, (c) a diazo compound, (d) halogen or a halogen acid, and the like.

Examples of the metal compound (a) include metal compounds containing cerium, lead, silver, manganese, osmium, ruthenium, vanadium, thallium, copper, iron, bismuth, or nickel, and the like. Examples of such metal compounds include (a1) cerium salts (e.g., tetravalent cerium salts) such as cerium (IV) ammonium nitrate (CAN: cerium (IV) ammonium hexanitrate), cerium (IV) acetate, cerium (IV) nitrate and cerium (IV) sulfate; (a2) lead compounds (e.g., tetravalent lead compounds) such as lead tetraacetate and lead (IV) oxide; (a3) silver compounds such as silver (I) oxide, silver (II) oxide, silver carbonate (Fetizon reagent) and silver nitrate; (a4) manganese compounds such as permanganese salts, active manganese dioxide and manganese (III) salts; (a5) osmium compounds such as osmium tetroxide; (a6) ruthenium compounds such as ruthenium tetroxide; (a7) vanadium compounds such as $VOCl_3$, $VOF_3$, $V_2O_5$, $NH_4VO_3$ and $NaVO_3$; (a8) thallium compounds such as thallium (III) acetate, thallium (III) trifluoroacetate and thallium (III) nitrate; (a9) copper compounds such as copper (II) acetate, copper (II) trifluoromethanesulfonate, copper (II) trifluoroborate, copper (II) chloride and copper (I) acetate; (a10) iron compounds such as iron (III) chloride and potassium hexacyanoferrate (III), (a11) bismuth compounds such as sodium bismuthate, (a12) nickel compounds such as nickel peroxide, and the like.

Examples of the peroxide (b) include peracids such as peracetic acid and m-chloroperbenzoic acid; hydroxyperoxides including hydrogen peroxide, and alkyl hydroxyperoxide such as t-butyl hydroperoxide; diacyl peroxides, peracid esters, ketal peroxides, peroxydicarbonate, dialkyl peroxides, ketone peroxides and the like.

Examples of the diazo compound (c) include 2,2'-azobisisobutyronitrile, and the like.

Examples of the halogen or halogen acid (d) include halogen such as chlorine, bromine and iodine; perhalogen acid, halogen acid, halous acid and hypohalous acid and salts thereof, and the like. It is to be noted that halogen in the halogen acid may be chlorine, bromine, iodine, or the like. Also, exemplary compounds to be the halogen acid or salts thereof include sodium perchlorate, sodium bromate, and the like.

Among these one-electron oxidants, the peroxide (b) and the diazo compound (c) are preferred, and m-chloroperbenzoic acid, t-butylhydroperoxide, and 2,2'-azobisisobutyronitrile are particularly preferred. These one-electron oxidants are preferably used since attachment of metallic residues and the like on the substrate can be avoided. The promoter (E) may be used alone, or two or more thereof may be used in combination.

The content of the promoter (E) in the composition for forming a resist underlayer film is usually no greater than 1,000 parts by mass, preferably 0.01 parts by mass to 500 parts by mass, and more preferably 0.1 parts by mass to 100 parts by mass with respect to the compound (A) 100 parts by mass.

<(F) Additive>

The additive (F) which may be used includes, for example, those described in paragraph Nos. [0088] to [0093] of JP-A No. 2004-168748, and the like. The additive (F) may include for example, a binder resin, a radiation absorbent, a surfactant, a storage stabilizer, a defoaming agent, an adhesion aid, and the like.

As the binder resin, a variety of thermoplastic resins and thermosetting resin other than the polymer (A1) can be used. The thermoplastic resin is a component that has an effect of imparting flow performances and mechanical characteristics and the like of the blended thermoplastic resin to the underlayer film. Alternatively, the thermosetting resin can be preferably used as a binder resin since it is a component which is hardened by heat to be insoluble in the solvent, and thus has an effect of preventing inter mixing between the resulting resist underlayer film and a resist coating film formed thereon. Of these, thermosetting resins such as urea resins, melamine resins and aromatic hydrocarbon resins are preferred. These binder resins may be used alone, or two or more thereof may be used in combination.

The content of the binder resin is usually no greater than 20 parts by mass, and preferably no greater than 10 parts by mass with respect to 100 parts by mass of the compound (A) in the composition for forming a resist underlayer film.

The content of the radiation absorbent is usually no greater than 100 parts by mass, and preferably no greater than 50 parts by mass with respect to 100 parts by mass of the compound (A) in the composition for forming a resist underlayer film.

The aforementioned surfactant is a component having effects of improving coatability, striation, wettability, developability and the like. These surfactants may be used alone, or two or more thereof may be used in combination.

The content of the surfactant is usually no greater than 15 parts by mass, and preferably no greater than 10 parts by mass with respect to 100 parts by mass of the polymer (A) in the resin composition for forming a resist underlayer film.

<Method for Preparing Composition for Resist Underlayer Film Formation>

The composition for forming a resist underlayer film may be prepared by, for example, dissolving the polymer (A) and an optional component as needed, in the solvent (B). After the dissolution, the solution thus obtained is preferably filtrated with a membrane filter having a pore size of about 0.1 μm, or the like.

<Resist Underlayer Film>

The resist underlayer film of the present invention is formed from the composition for forming a resist underlayer film. The resist underlayer film is superior in the bend resistance and etching resistance, and is thus also superior in the pattern transfer performance to a substrate to be processed.

This resist underlayer film can be suitably used in multilayer resist processes. In the multilayer resist process, after a resist underlayer film is formed on a substrate to be processed and then a resist pattern is formed on the resist underlayer film, the resist pattern is once transferred to the resist underlayer film to form a resist underlayer film pattern, and thereafter transferred to the substrate to be processed using the resist underlayer film pattern as an etching mask.

The content of the hydrogen atoms in the resist underlayer film is preferably 0 to 50 atom %, and more preferably 0 to 35 atom %. The content of the hydrogen atoms in the resist underlayer film can be determined by measuring the elemental composition of the resist underlayer film on carbon, hydrogen and nitrogen.

<Method for Forming Resist Underlayer Film>

The method for forming a resist underlayer film of the present invention includes steps of (1) applying the composition for forming a resist underlayer film on a substrate to be processed to form a coated film, and (2) heating the coated film to form a resist underlayer film.

Examples of the substrate to be processed which may be used include a silicon wafer, a wafer covered with aluminum, and the like. In addition, the method for applying the composition for forming a resist underlayer film to the substrate to be processed is not particularly limit, and an appropriate method such as e.g., rotation coating, cast coating or roll coating may be employed.

The heating of the coated film is carried out usually in the atmosphere. The heating temperature is usually about 300° C. to 500° C., and preferably about 350° C. to 450° C. When the heating temperature is less than 300° C., oxidizative crosslinking fails to proceed sufficiently, whereby characteristics required for a resist underlayer film may not be achieved. The heating time is usually 30 sec to 1200 sec, and preferably 60 sec to 600 sec.

The oxygen concentration in hardening the coated film is preferably no less than 5% by volume. When the oxygen concentration in forming the coated film is too low, oxidizative crosslinking of the resist underlayer film fails to proceed sufficiently, whereby characteristics required for a resist underlayer film may not be achieved.

Prior to heating the coated film at a temperature of 300° C. to 500° C., it may be preheated at a temperature of 60° C. to 250° C. Although the heating time in the preheating is not particularly limited, it is preferably 10 sec to 300 sec, and more preferably 30 sec to 180 sec. By carrying out the preheating, the solvent is evaporated beforehand to make the film denser, and thus the dehydrogenation reaction can be efficiently allowed to proceed.

In the method for forming a resist underlayer film, the coated film is usually hardened by heating of the coated film as described above, whereby the resist underlayer film is formed. However, a specified photocuring agent (crosslinking agent) may be included in the composition for forming a resist underlayer film to permit photocuring by subjecting the coated film after being heated to a step of irradiation with a ray, whereby formation of a resist underlayer film is also enabled. The type of radiation used in the irradiation step for exposure is appropriately selected from visible rays, ultraviolet rays, deep ultraviolet rays, X-rays, electron beams, γ-rays, molecular beams, ion beams, and the like according to the type of acid generator (D) blended in the composition for forming a resist underlayer film.

<Method for Forming Pattern>

The method for forming a pattern using the composition for forming a resist underlayer film has:

(1) a resist underlayer film formation step (hereinafter, may be also referred to as "step (1)") of forming a resist underlayer film on the upper face side of a substrate to be processed using the composition for forming a resist underlayer film;

(2) a resist coating film formation step (hereinafter, may be also referred to as "step (2)") of forming a resist coating film by applying the resist composition on the resist underlayer film;

(3) an exposure step (hereinafter, may be also referred to as "step (3)") of exposing the resist coating film by selectively irradiating the resist coating film with a radiation;

(4) a resist pattern formation step (hereinafter, may be also referred to as "step (4)") of forming a resist pattern by developing the exposed resist coating film; and (5) a pattern formation step (hereinafter, may be also referred to as "step (5)") of forming a predetermined pattern on the substrate to be processed by sequentially dry etching the resist underlayer film and the substrate using the resist pattern as a mask.

In the step (1), a resist underlayer film is formed on the upper face side of a substrate to be processed using the composition for forming a resist underlayer film. In connection with the method for forming a resist underlayer film, see the above detailed description. The resist underlayer film formed in the step (1) has a film thickness of usually 0.05 μm to 5 μm.

In addition, the method for forming a pattern may further include (1') a formation step of an intermediate layer (intermediate coating film) on the resist underlayer film after the step (1) as needed. The intermediate layer is provided with functions in attempts to further augment functions of the resist underlayer film and/or the resist coating film in forming the resist pattern, or to impart functions not possessed by these films. In the case in which, for example, an antireflection film is formed as the intermediate layer, an antireflecting function of the resist underlayer film can be further augmented.

The intermediate layer can be formed from an organic compound or an inorganic oxide. Examples of commercially available products of the organic compound include trade names "DUV-42", "DUV-44", "ARC-28" and "ARC-29" (manufactured by Brewer Science Inc.,; "AR-3" and "AR-19" (manufactured by Lohm and Haas Company), and the like. Examples of the commercially available products of the inorganic oxide include "NFC SOG01", "NFC SOG04", "NFC SOG080" (manufactured by JSR Corp.), and the like. Also, polysiloxane, titanium oxide, aluminum oxide (alumina), tungsten oxide or the like produced by a CVD method may be used.

Although the method for forming the intermediate layer is not particularly limited, for example, a coating method, a CVD method or the like may be employed. Of these, a coating method is preferred. When the coating method is employed, the intermediate layer may be continuously formed after the formation of the resist underlayer film.

The film thickness of the intermediate layer is not particularly limit, and may be appropriately determined according to the functions demanded for the intermediate layer, but the film thickness is preferably 10 nm to 3,000 nm, and more preferably 20 nm to 300 nm.

In the step (2), a resist coating film is formed by applying the resist composition on the resist underlayer film. More specifically, after applying the resist composition such that the resulting resist coating film has a predetermined film thickness, the solvent in the coated film is evaporated by prebaking, thereby capable of forming the resist coating film.

Examples of the resist composition include: chemically amplified resist compositions of positive or negative type containing a photo acid generator; positive-type resist compositions containing an alkali-soluble resin and a quinonediazide based photosensitizer; negative type resist compositions containing an alkali-soluble resin and a crosslinking agent, and the like.

The total solid content of the resist composition is usually about 1 to 50% by mass. The resist composition is generally filtrated by passing through, for example, a filter having a pore size of about 0.2 μm, and is subjected to formation of the resist coating film. It should be noted that a commercially available resist composition may be directly used in this step.

The process for applying the resist composition is not particularly limit, and for example, a spin coating method, and the like may be employed. In addition, the prebaking temperature may be appropriately regulated to meet the type and the like of the resist composition used, but is usually about 30° C. to 200° C., and preferably 50° C. to 150° C.

In the step (3), the resist coating film is selectively irradiated with a radiation to execute the exposure of the resist coating film. The radiation used for the exposure is appropriately selected from among visible rays, ultraviolet rays, deep ultraviolet rays, X-rays, electron beams, γ-rays, molecular beams, ion beams and the like according to the type of the photo acid generator used in the resist composition. Of these, deep ultraviolet rays are preferred, and a KrF excimer laser beam (248 nm), an ArF excimer laser beam (193 nm), an $F_2$ excimer laser beam (wavelength: 157 nm), a $Kr_2$ excimer laser beam (wavelength: 147 nm), an ArKr excimer laser beam (wavelength: 134 nm), extreme ultraviolet rays (wavelength: 13 nm, etc.) and the like are more preferred. The method for forming a resist pattern may not include a development process as in nanoimprinting methods and the like.

After the exposure as described above, post-baking may be carried out for improving resolution, pattern profile, developability, and the like. The post-baking temperature may be appropriately regulated to meet the type and the like of the resist composition used, but is usually about 50° C. to 200° C., and preferably 70° C. to 150° C.

In the step (4), the exposed resist coating film is developed to form a resist pattern. The developer used in this step is appropriately selected according to the type of the resist composition used. Examples of the developer include alkaline aqueous solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene or the like. An appropriate amount of a water-soluble organic solvent, for example, an alcohol such as methanol or ethanol, as well as a surfactant and the like may be also added to the alkaline aqueous solution.

After the development with the developer described above, the film is washed and dried to form a predetermined resist pattern.

In the step (5), the resist underlayer film and the substrate to be processed are sequentially dry etched using the resist pattern as a mask to form a predetermined pattern on the substrate to be processed. In this dry etching, for example, gas plasma such as oxygen plasma may be used. After the dry etching of the resist underlayer film, the substrate to be processed is dry etched to obtain a substrate to be processed having a predetermined pattern.

Moreover, the method for forming a pattern carried out using the composition for forming a resist underlayer film may include in addition to the foregoing method for forming a pattern, for example, a method for forming a pattern carried out utilizing a nanoimprinting method, etc., and the like.

EXAMPLES

Hereinafter, the present invention is explained in detail by way of Examples, but the present invention is not in any way limited thereto. The measurement of physical property values in these Examples was made according to the following method.

Weight Average Molecular Weight (Mw)

The weight average molecular weight (Mw) of the polymer was measured by gel permeation chromatography using a GPC column ("G2000HXL"×2, "G3000HXL"×1 (manufactured by Tosoh Corporation)), under conditions involving a flow rate of 1.0 mL/min, an elution solvent of tetrahydrofuran and a column temperature of 40° C., and with a refractive index detector, using monodisperse polystyrene as a standard.

Synthesis of Compound (A)

Synthesis Example 1

A reactor equipped with a condenser, a thermometer and a stirrer was charged with 100 parts by mass of 2,7-dihydroxynaphthalene, 200 parts by mass of propylene glycol monomethyl ether acetate and 50 parts by mass of paraformaldehyde. After 2 parts by mass of oxalic acid were added thereto and the temperature of the mixture was elevated to 120° C. while permitting dehydration, the reaction was allowed for 5 hours to obtain a polymer (a1-1). Thereafter, 300 parts by mass of paratoluenesulfonyl chloride and 50 parts by mass of pyridine were added thereto to obtain a polymer (A1-1) having a structure represented by the following formula (A1-1) that is a condensation reactant. This polymer (A1-1) had a Mw of 3,000.

[formula 11]

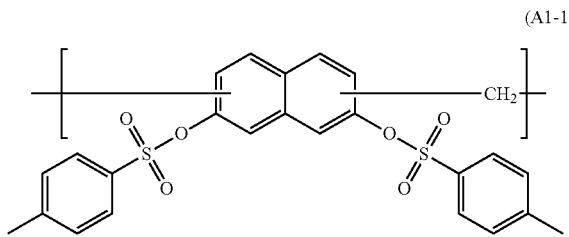

(A1-1)

Synthesis Example 2

A reactor equipped with a condenser, a thermometer and a stirrer was charged with 100 parts by mass of 2-hydroxynaphthalene, 200 parts by mass of propylene glycol monomethyl ether acetate and 50 parts by mass of paraformaldehyde. After 2 parts by mass of oxalic acid were added thereto and the temperature of the mixture was elevated to 120° C. while permitting dehydration, the reaction was allowed for 5 hours. Thereafter, 300 parts by mass of paratoluenesulfonyl chloride and 50 parts by mass of pyridine were added thereto to obtain a polymer (A1-2) having a structure represented by the following formula (A1-2) that is a condensation reactant. This polymer (A1-2) had a Mw of 3,000.

[formula 12]

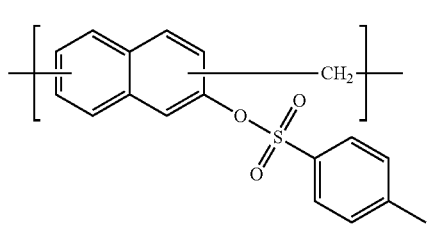

(A1-2)

Synthesis Example 3

A reactor equipped with a condenser, a thermometer and a stirrer was charged with 100 parts by mass of phenol, 200 parts by mass of propylene glycol monomethyl ether acetate and 50 parts by mass of paraformaldehyde. After 2 parts by mass of oxalic acid were added thereto and the temperature of the mixture was elevated to 120° C. while permitting dehydration, the reaction was allowed for 5 hours to obtain a polymer (a1-2). Thereafter, 300 parts by mass of paratoluenesulfonyl chloride and 50 parts by mass of pyridine were added thereto to obtain a polymer (A1-3) having a structure represented by the following formula (A1-3) that is a condensation reactant. This polymer (A1-3) had a Mw of 5,000.

[formula 13]

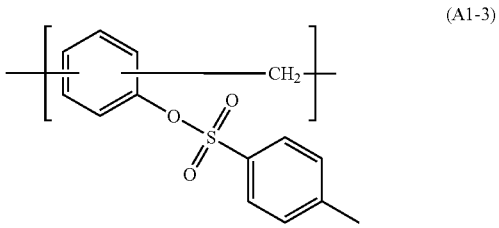

(A1-3)

Synthesis Example 4

A reactor equipped with a condenser, a thermometer and a stirrer was charged with 100 parts by mass of phenol, 200 parts by mass of propylene glycol monomethyl ether acetate and 50 parts by mass of paraformaldehyde. After 2 parts by mass of oxalic acid were added thereto and the temperature of the mixture was elevated to 120° C. while permitting dehydration, the reaction was allowed for 5 hours. Thereafter, 300 parts by mass of 2-thiophenesulfonyl chloride and 50 parts by mass of pyridine were added thereto to obtain a polymer (A1-4) having a structure represented by the following formula (A1-4) that is a condensation reactant. This polymer (A1-4) had a Mw of 5,000.

[formula 14]

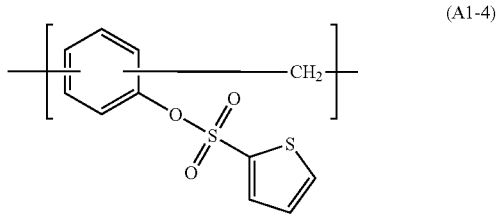

(A1-4)

Synthesis Example 5

A reactor equipped with a condenser, a thermometer and a stirrer was charged with 100 parts by mass of p-hydroxystyrene, 200 parts by mass of propylene glycol monomethyl ether and 50 parts by mass of paraformaldehyde. After 2 parts by mass of oxalic acid were added thereto and the temperature of the mixture was elevated to 120° C. while permitting dehydration, the reaction was allowed for 5 hours. Thereafter, 300 parts by mass of 2-thiophenesulfonyl chloride and 50 parts by mass of pyridine were added thereto to obtain a polymer (A1-5) having a structure represented by the following formula (A1-5) that is a condensation reactant. This polymer (A1-5) had a Mw of 5,000.

[formula 15]

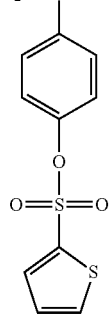

(A1-5)

Synthesis Example 6

A reactor equipped with a condenser, a thermometer and a stirrer was charged with 100 parts by mass of 4,4'-[1-[4-[2-(4-hydroxyphenyl)propan-2-yl]phenyl]ethylidene]diphenol-phenol, 200 parts by mass of propylene glycol monomethyl ether acetate and 50 parts by mass of paraformaldehyde. After 2 parts by mass of oxalic acid were added thereto and the temperature of the mixture was elevated to 120° C. while permitting dehydration, the reaction was allowed for 5 hours. Thereafter, 300 parts by mass of 2-thiophenesulfonyl chloride and 50 parts by mass of pyridine were added thereto to obtain a compound (A2-1) having a structure represented by the following formula (A2-1).

[formula 16]

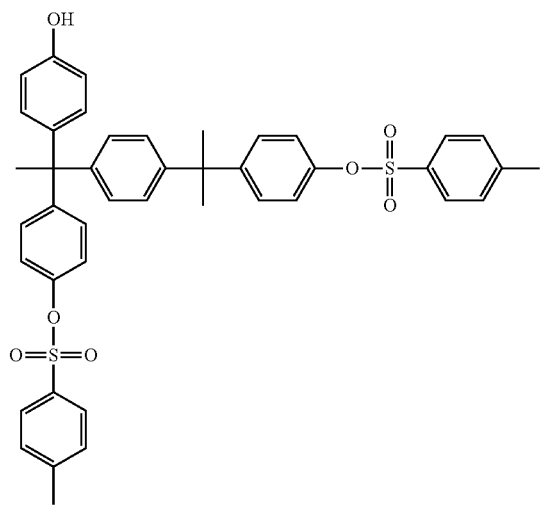

(A2-1)

Synthesis Example 7

A reactor equipped with a condenser, a thermometer and a stirrer was charged with 125 parts by mass of the polymer (a1-1) obtained as an intermediate in Synthesis Example 1, 25 parts by mass of thiophenemethanol, 20 parts by mass of p-toluenesulfonic acid, and 150 parts by mass of methyl isobutyl ketone. After the temperature of the mixture was elevated to 100° C., the reaction was allowed for 4 hours to obtain a polymer (a1-3) having a structure represented by the following formula (a1-3). This polymer (a1-3) had a Mw of 3,000.

[formula 17]

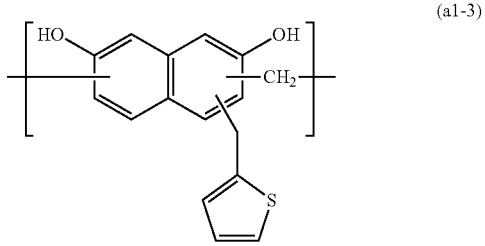

(a1-3)

Preparation of Composition for Forming Resist Underlayer Film

Example 1

The polymer (A1-1) as the compound (A) in an amount of 100 parts by mass, and a 0.005 parts by mass of a surfactant were dissolved in 450 parts by mass of cyclohexanone as the solvent (B). Thereafter, this solution was filtrated through a membrane filter having a pore size of 0.1 μm to prepare a composition for forming a resist underlayer film of Example 1.

Examples 2 to 7 and Comparative Examples 1 to 3

Compositions for forming a resist underlayer film of Examples and Comparative Examples were prepared in a similar manner to Example 1 except that the type and the blended amount of the compound (A) in Example 1 were changed as listed in Table 1. The polymer (a1-1) used in Example 6 and Comparative Example 1 was referred to as an intermediate in Synthesis Example 1, and the polymer (a1-2) used in Example 7 and Comparative Example 2 was referred to as an intermediate in Synthesis Example 3.

<Evaluation>

A resist underlayer film was formed using each composition for forming a resist underlayer film obtained in the above Examples and Comparative Examples according to the following method, and evaluated by determining the elemental composition, pattern transfer performance, etching resistance and sulfur-containing outgas controllability according to the following methods. The obtained results of evaluation are shown in Table 1.

Formation of Resist Underlayer Film

The composition for forming a resist underlayer film obtained as described above was applied on a silicon wafer having a diameter of 8 inches by a spin coating method. Thereafter, the silicon wafer was heated on a hot plate with an oxygen concentration of 20% by volume at 180° C. for 60 sec, followed by heating at 350° C. for 120 sec to form a resist underlayer film having a film thickness of 0.3 μm.

Bend Resistance

A silicon-containing intermediate layer forming composition for three-layer resist processing (NFC SOG080, manufactured by JSR Corp.) was spin coated on the resist underlayer film formed as described above was heated on a hot plate at 300° C. for 60 sec to form an intermediate layer coating film having a film thickness of 0.05 μm. Thereafter, a resist composition for ArF (ARF AR2772JN, manufactured by JSR Corp.) was spin coated on this intermediate layer coating film, and prebaked on a hot plate at 130° C. for 90 sec to form a resist coating film having a film thickness of 0.2 μm.

Thereafter, the resist coating film was exposed using an ArF excimer laser photolithography apparatus (NSR-S610C, manufactured by NIKON Corp., lens numerical aperture: 1.30, wavelength in exposure: 193 nm) through a photomask having a predetermined mask pattern formed. Then the film was post-baked on a hot plate at 130° C. for 90 sec. Subsequently, an aqueous solution of 2.38% tetramethylammonium hydroxide was used for development at 25° C. for 1 min, followed by washing with water to obtain a positive-type resist pattern (line-and-space pattern (1L/1S) with a line width of 40 nm). Using this resist pattern as a mask, dry etching was carried out with an etching apparatus (Telius SCCM, manufactured by Tokyo Electron Ltd.), under conditions involving an etching gas being $CF_4$/Ar ($CF_4$: 200 mL/min) and an RF power of 300 W to transfer the resist pattern to the intermediate layer coating film.

Next, using the intermediate coating film having the transferred resist pattern as a mask, an etching treatment was carried out with the aforementioned etching apparatus under conditions involving an etching gas being $O_2$/$N_2$ ($O_2$: 50 mL/min, $N_2$: 50 mL/min) and an RF power of 700 W to transfer the pattern to the resist underlayer film. Subsequently, using the resist underlayer film having the transferred pattern as a mask, an etching treatment was carried out with the aforementioned etching apparatus under conditions involving an etching gas of $CF_4$/Ar ($CF_4$: 200 mL/min, Ar: 400 mL/min) and an RF power of 1,000 W to transfer the pattern to a $SiO_2$ substrate (silicon wafer having a diameter of 8 inches).

A: LWR of the resist underlayer film pattern after the etching being equivalent or improved as compared with that found before the etching on the $SiO_2$ substrate B: LWR of the resist underlayer film pattern after the etching being deteriorated as compared with that found before the etching on the $SiO_2$ substrate Etching Resistance The resist underlayer film formed as described above was subjected to an etching treatment with an etching apparatus (EXAM, manufactured by Shinko Seiki Co., Ltd.) under conditions involving $CF_4$/Ar ($CF_4$: 40 mL/min, Ar: 20 mL/min) and an RF power of 200 W. Etching rate (unit: nm/min) was determined from the measurements of the film thicknesses before and after the etching treatment in this inspection to evaluate the etching resistance.

Sulfur-Containing Outgas Controllability

The composition for forming a resist underlayer film was applied on a silicon wafer having a diameter of 8 inches by a spin coating method. With respect to the wafer on which the composition for forming a resist underlayer film was applied, the sulfur content (% by mass) contained in the form of sulfides or thiols, which were odorous components in the outgas generated during the formation of the resist underlayer film, was determined with head space gas chromatography (HS-GC) while heating to 250° C.

Based on the sulfur content in the resulting outgas, the sulfur-containing outgas controllability was evaluated according to the following criteria.

A: the sulfur content in the outgas being lower as compared with that of Comparative Example 3

B: the sulfur content in the outgas being equivalent or higher as compared with that of Comparative Example 3

The results obtained by the evaluations described above are shown in Table 1 below.

TABLE 1

| | Polymer | | Crosslinkable compound | | Results of evaluation | | |
|---|---|---|---|---|---|---|---|
| | Type | Blended amount (parts by mass) | Type | Blended amount (parts by mass) | Bend resistance | Etching rate (nm/min) | Sulfur-containing outgas controllability |
| Example 1 | A1-1 | 10 | — | — | A | 120 | A |
| Example 2 | A1-2 | 10 | — | — | A | 120 | A |
| Example 3 | A1-3 | 10 | — | — | A | 140 | A |
| Example 4 | A1-4 | 10 | — | — | A | 140 | A |
| Example 5 | A1-5 | 10 | — | — | A | 140 | A |
| Example 6 | a1-1 | 7 | A2-1 | 3 | A | 120 | A |
| Example 7 | a1-2 | 7 | A2-1 | 3 | A | 140 | A |
| Comparative Example 1 | a1-1 | 10 | — | — | B | 150 | A |
| Comparative Example 2 | a1-3 | 10 | — | — | B | 180 | A |
| Comparative Example 3 | a1-3 | 10 | — | — | A | 130 | — |

Each of pattern configurations of the resist underlayer film before and after the etching operation on the $SiO_2$ substrate was observed from above with a scanning electron microscope (SEM) (CG-4000, manufactured by Hitachi High-Technologies Corporation). The line width in each pattern was measured at arbitrary ten points, and a value of variance of the line width expressed in terms of three sigma was specified as LWR (Line Width Roughness). Evaluation on the bend resistance of the resist underlayer film was made according to the following criteria.

From the results of the foregoing Examples and Comparative Examples, it is indicated that according to the method for forming a pattern and the composition for forming a resist underlayer film of the present invention, a resist underlayer film that is superior in the bend resistance and pattern transfer performance in RIE, and is also superior in the etching resistance can be formed. In addition, it was also indicated that as compared with the thiophene based underlayer film material of Comparative Example 3, controllability of the outgas odor in forming an underlayer film is enabled.

INDUSTRIAL APPLICABILITY

The method for forming a pattern, the method for forming a resist underlayer film, the composition for forming a resist underlayer film, and the resist underlayer film of the present invention can be suitably used for micro processing in lithography processes, particularly multilayer resist processes suited for manufacture of highly integrated circuit elements.

What is claimed is:

1. A method for forming a pattern, the method comprising:
   (1) forming a resist underlayer film on the upper face side of a substrate to be processed using a composition for forming a resist underlayer film, the composition comprising a polymer comprising a structural unit derived from (A) a compound comprising a group represented by the following formula (1):

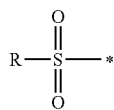

(1)

wherein, in the formula (1), R represents a monovalent organic group having 1 to 30 carbon atoms, the monovalent organic group represented by R does not include an oxygen atom at the end of the side adjacent the sulfur atom, and * represents a bonding hand;
   (2) forming a resist coating film by applying a resist composition on the resist underlayer film;
   (3) exposing the resist coating film by selectively irradiating the resist coating film with a radiation;
   (4) forming a resist pattern by developing the exposed resist coating film; and
   (5) forming a predetermined pattern on the substrate to be processed by sequentially dry etching the resist underlayer film and the substrate using the resist pattern as a mask,
wherein the compound (A) comprises at least one ring selected from the group consisting of an aromatic ring and a heteroaromatic ring, and the bonding hand denoted by * in the group represented by the above formula (1) bonds via an oxygen atom with the aromatic ring or the heteroaromatic ring.

2. The method for forming a pattern according to claim 1, further comprising after the step of (1) forming a resist underlayer film and prior to the step of (2) forming a resist coating film, a step of:
   (1') forming an intermediate layer on the upper face side of the resist underlayer film, and wherein
   in the step of forming a pattern (5), the intermediate layer is further dry etched.

3. The method for forming a pattern according to claim 1, wherein R in the above formula (1) represents at least one group selected from the set consisting of an aryl group which may have a substituent and a heteroaryl group which may have a substituent.

4. The method for forming a pattern according to claim 1, wherein the compound (A) comprises a partial structure represented by the following formula (2):

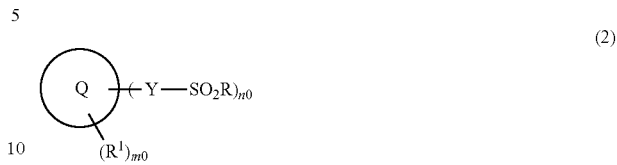

(2)

wherein, in the formula (2), Q represents a partial structure consisting of an aromatic ring or a heteroaromatic ring; R is as defined in the above formula (1); Y represents an oxygen atom; n0 is an integer of 1 or greater; $R^1$ represents a monovalent organic group; m0 is an integer of 0 or greater; and provided that the number of R, Y or $R^1$ is more than one, each R, each Y and each $R^1$ may be the same or different.

5. The method for forming a pattern according to claim 1, wherein the polymer is at least one resin selected from the group consisting of a novolak resin, a resol resin, a styrene resin, an acenaphthylene resin and a polyarylene resin.

6. The method for forming a pattern according to claim 1, wherein the composition for forming a resist underlayer film further comprises (B) a solvent.

7. The method for forming a pattern according to claim 1, wherein the resist underlayer film is an organic film.

8. A method for forming a resist underlayer film comprising:
   (1) forming a coated film by applying a composition for forming a resist underlayer film, the composition comprising a polymer comprising a structural unit derived from (A) a compound comprising a group represented by the following formula (1) on a substrate to be processed; and
   (2) forming a resist underlayer film by heating the coated film,

(1)

wherein, in the formula (1), R represents a monovalent organic group having 1 to 30 carbon atoms, the monovalent organic group represented by R does not include an oxygen atom at the end of the side adjacent the sulfur atom, and * represents a bonding hand,
wherein the compound (A) comprises at least one ring selected from the group consisting of an aromatic ring and a heteroaromatic ring, and the bonding hand denoted by * in the group represented by the above formula (1) bonds via an oxygen atom with the aromatic ring of the heteroaromatic ring.

9. The method for forming a resist underlayer film according to claim 8, wherein the resist underlayer film is an organic film.

* * * * *

UNITED STATES PATENT AND TRADEMARK OFFICE
CERTIFICATE OF CORRECTION

PATENT NO.        : 9,040,232 B2                     Page 1 of 1
APPLICATION NO.   : 13/246915
DATED             : May 26, 2015
INVENTOR(S)       : Shin-ya Minegishi et al.

It is certified that error appears in the above-identified patent and that said Letters Patent is hereby corrected as shown below:

IN THE CLAIMS

Col. 32 Lines 54-55, "the aromatic ring of the heteroaromatic ring." should read -- the aromatic ring or the heteroaromatic ring. --.

Signed and Sealed this
Twentieth Day of October, 2015

Michelle K. Lee
*Director of the United States Patent and Trademark Office*